(12) United States Patent
Pang et al.

(10) Patent No.: US 7,135,867 B2
(45) Date of Patent: Nov. 14, 2006

(54) METHOD AND APPARATUS FOR VERIFYING CONNECTIVITY OF AN INSTRUMENTATION SYSTEM

(75) Inventors: Stephen Y C Pang, Bath (GB); Patrick W Best, Bristol (GB); Alan S March, Gloucestershire (GB); Christopher M Morgan, Gloucestershire (GB); David A Chaboty, Huber Heights, OH (US)

(73) Assignee: Rolls-Royce plc, London (GB)

( * ) Notice: Subject to any disclaimer, the term of this patent is extended or adjusted under 35 U.S.C. 154(b) by 0 days.

(21) Appl. No.: 11/246,518

(22) Filed: Oct. 11, 2005

(65) Prior Publication Data

US 2006/0081701 A1   Apr. 20, 2006

Related U.S. Application Data

(60) Provisional application No. 60/617,255, filed on Oct. 12, 2004.

(51) Int. Cl.
*G01R 31/04* (2006.01)
*G01N 27/82* (2006.01)

(52) U.S. Cl. .................................. 324/538; 324/242

(58) Field of Classification Search ................ 324/538, 324/537, 500, 76.11, 144, 242, 243, 523, 324/555, 527–529
See application file for complete search history.

(56) References Cited

U.S. PATENT DOCUMENTS

| 5,625,297 | A  | * | 4/1997 | Arnaudov et al. | ........... 324/754 |
| 6,590,398 | B1 | * | 7/2003 | Doi | ............................ 324/523 |
| 6,621,831 | B1 | * | 9/2003 | Linz | ........................... 370/480 |
| 2005/0198272 | A1 | * | 9/2005 | Bernard et al. | ............. 709/224 |

* cited by examiner

*Primary Examiner*—Anjan Deb
*Assistant Examiner*—Hoai-An D. Nguyen
(74) *Attorney, Agent, or Firm*—Oliff & Berridge, PLC

(57) ABSTRACT

An instrumentation system including a plurality of sensors attached to a test piece, each of the sensors provided with an electrical signal generating device and an electrical signal measurement device. Each sensor is located remotely from its electrical signal measurement device, and connected thereto by connectors. A method of testing connectivity of the instrumentation system including: inducing an electrical signal in a first sensor; and checking that the electric signal is received in the corresponding signal measurement device.

4 Claims, 4 Drawing Sheets

METHOD AND APPARATUS FOR VERIFYING CONNECTIVITY OF AN INSTRUMENTATION SYSTEM

This nonprovisional application claims the benefit of U.S. Provisional Application No. 60/617,255, filed Oct. 12, 2004.

The present invention relates to a method and apparatus for verifying connectivity of instrumentation systems. In particular, the present invention is suited to instrumentations systems which utilise strain gauges.

Instrumentation systems used, for example, in testing of gas turbine engines comprise a large number of sensors, applied to the gas turbine engine as and where an conditions are to be monitored during operation of the engine. Such sensors typically modify an electrical signal passing through them to indicate conditions. These signals are measured with electrical signal measurement means, such as an ammeter or oscilloscope. Such measurement means are linked directly to the sensors by electrical wires or remotely, via transducer means. By measuring the amount the signal is modified by the sensor, conditions at the sensor location are deduced.

A typical test engine will have a large number of sensors applied throughout. Because the sensors are needed to determine conditions of components located within the gas turbine engine, the sensors must be applied during engine build. Wires called 'lead-outs' are provided which extend from the sensor to the engine exterior, and which carry an electrical signal to the sensor and from the sensor. Once fully assembled, the engine is taken to a test facility, and the lead-outs are connected to the externally located electrical signal measurement means and signal generation means.

The large number of lead-outs which must be connected to the instrumentation system, 256 is common, can lead to the wrong sensors being connected to the wrong electrical signal measurement means and the wrong electrical signal generation means. At the least, connection of the wrong sensor to the wrong measurement means can lead to erroneous data being gathered, resulting in time consuming analysis. In a worst case, an entire test can be rendered useless, at great expense.

It is known in the art to check connectivity of an instrumentation system, i.e. that the correct sensor lead-outs are joined to the correct signal generation means and signal measurement means, by mechanically exciting the engine adjacent individual sensors, where such sensors are strain gauges, and monitoring the associated signal measurement means for a response. However, this method has a number of drawbacks. First, sensors and their lead-outs tend to be sensitive components. Injudicious use of force can lead to damage. Second, it is typical to have a number of sensors on a particular component of a gas turbine engine. Excitation of a single sensor in such a situation is difficult, particularly where the component is cantilevered from the main engine structure, as is the case with an aerofoil blade. Third, the sensors are often located deep within the engine, preventing access for mechanical excitation.

The present invention provides method and means for checking connectivity of an instrumentation system which addresses the problems set out above.

According to the present invention there is provided a method of testing connectivity of an instrumentation system, said instrumentation system comprising a plurality of sensors attached to a test piece, each of said sensors provided with electrical signal generating means and electrical signal measurement means, wherein each sensor is located remotely from its electrical signal measurement means, and connected thereto by connecting means, the method comprising the steps of;

inducing an electrical signal in a first sensor,
checking that the electric signal is received in the corresponding signal measurement means.

According to a further aspect of the present invention there is provided apparatus for testing the connectivity of an instrumentation system, the apparatus comprising an electromagnet and signal generation means for supplying an alternating current to the electromagnet.

The invention will now be described in more detail with reference to the accompanying drawings in which.

Figure 1:
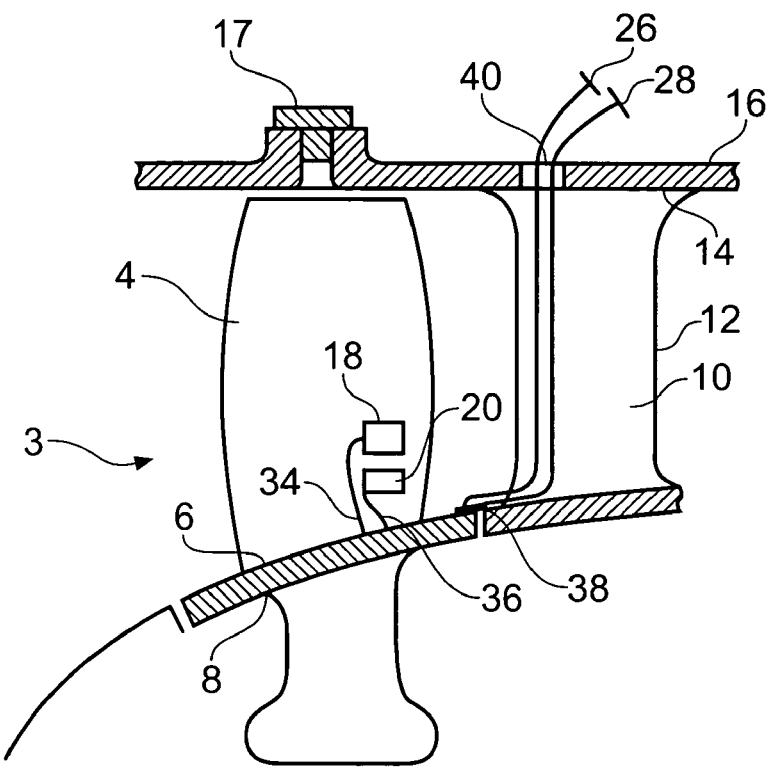
FIG. 1 shows a cross-section through a first stage of a gas turbine engine compressor.

Turning to FIG. 1, there is shown a cross-section through a first stage 2 of a gas turbine engine compressor. The stage comprises a rotative stage 3 comprising an annular array of compressor blades 4 which are cantilevered at their radially inner ends 6 from a rotatable hub 8, which is driven by a shaft (not shown). Immediately downstream of the rotatable stage 3 is a static stage 10 comprising an annular array of stators 12 cantilevered from their radially outer ends 14 from the engine casing 16, which comprises an annular duct, which extends forward to bound the rotatable stage 3. The engine casing is provided with a number of sealed boroscope apertures 17, which can be opened to allow insertion of a boroscope (not shown) into the engine.

Figure 2:
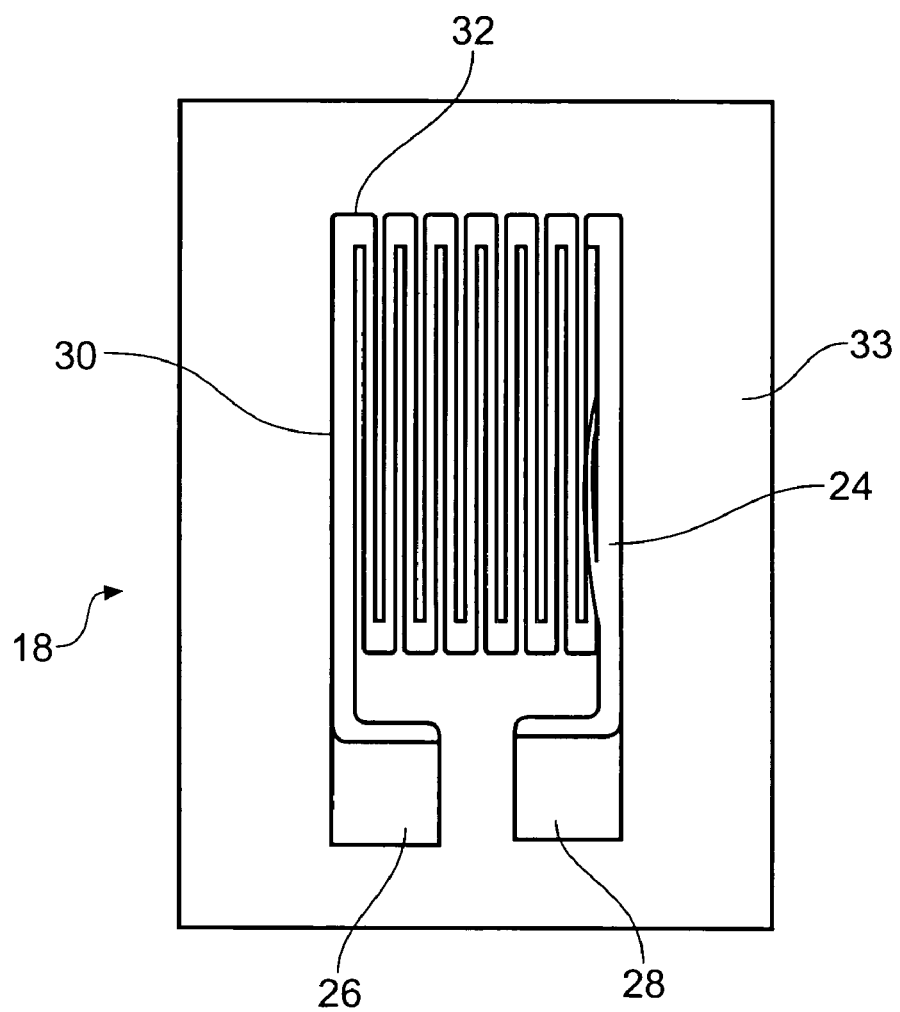
FIG. 2 shows a bonded resistance strain gauge.

The first stage 2 is provided with a first and second strain gauge 18,20, an example of which is shown in more detail at FIG. 2.

FIG. 2 shows the bonded resistance strain gauge 18 of FIG. 1 in more detail. Such gauges are used to measure strain and are used extensively in a variety of other sensor applications such as pressure sensors, load sensors and torque sensors. The gauge 18 comprises a metal foil element 24, which extends between a first terminal 26 and a second terminal 28. The element comprises a single continuous element, comprising a a plurality of elongate parallel elements 30 joined in series by short bridging elements 32. The element 24 is bonded to the compressor blade 4 by an adhesive layer that transmits strain from the blade 4 to the element 24 so that strain of the component in the major axis of the elongate elements 30 causes the elements to 'neck'. This results in a measurable change in the resistance of the gauge 18 whereas strain of the component in the direction of the short 'bridging elements' causes negligible change in resistance of the element 24. The resultant 'directionality' of the strain gauge enables direction of strain as well as magnitude to be measured where the gauge 18 is used in conjunction with a second gauge 20, located normal thereto, as shown in FIG. 1.

Referring back to FIG. 1, the terminals 26,28 of each strain gauge are attached to 'lead outs' 34,36 which comprise electrical wires. These wires are attached to the aerofoil and fed radially inwards to the hub 6 of the first rotatable stage 3 and then pass downstream, towards the static stage 10. They are attached to wires on the static stage via a slip ring arrangement 38 which ensures relative rotational movement between rotatable and static stages 3,10. The wires then feed radially outwards via a stator vane 12 and then pass through a hole 40 in the engine casing. The wires are terminated by connecting means 46 suitable for attachment to the rest of the instrumentation system. This is shown schematically in FIG. 3.

Figure 3:
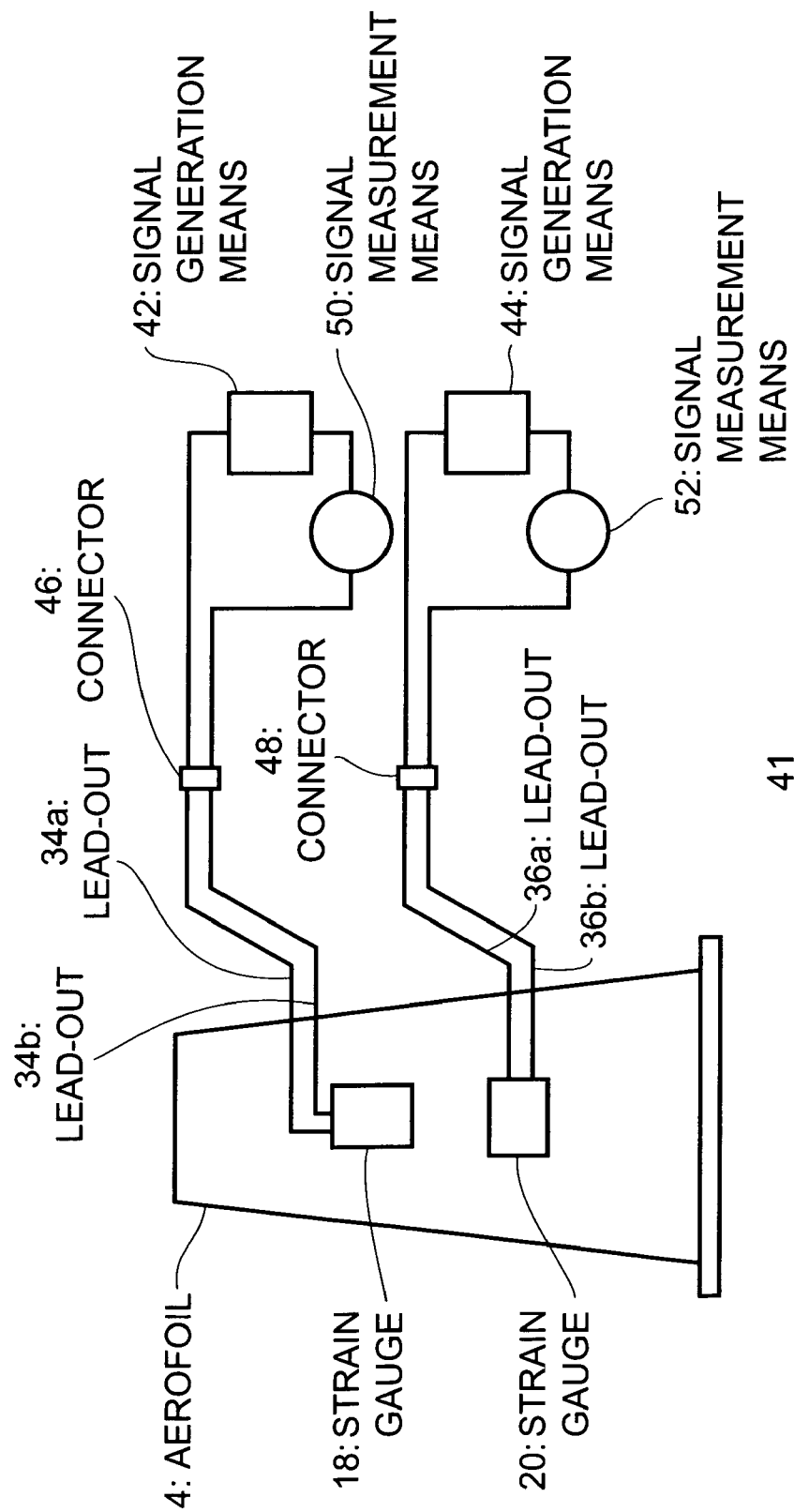
FIG. 3 shows a schematic view of an instrumentation system fitted to the gas turbine engine compressor of FIG. 1.

FIG. 3 shows, schematically, an instrumentation system 41. The system comprises first and second strain gauges 18,20, fitted to a compressor aerofoil 4. Each gauge is provided with a pair of lead-outs 34*a*, 34*b*, 36*a*, 36*b* which terminate outside of the engine casing (not shown). Each gauge is attached via its respective lead-outs to an individual signal generation means 42,44 in the present example a DC power source, and also to individual signal measurement means 50,52 via a connector 46,48.

In operation, each signal generation means 42,44 provides an electric signal, which passes through the strain gauges 18,20. The signal measurement means 50,52 measures the current in the circuit formed between the signal generation means 42,44 and the strain gauges 18,20. When the aerofoil 4 is strained, the first and second gauges 18,20 are also deformed. Each gauge 18,20 will modify the electrical signal in its respective circuit. From the measured change, the strain applied to the component 4 can then be calculated. By interpolating the results from each gauge 18,20, the direction of strain can be derived.

To ensure that the correct strain gauge 18,20 is connected correctly to the appropriate signal generation means 42,44 and signal measurement means 50,52, an electrical signal is induced into a first strain gauge 18 of the system, after connection of the lead outs 34,36. The appropriate signal measurement means 42 is then checked to ensure that the strain gauge is, as desired, attached to that measurement means 42. It will be understood that where the electrical signal is not detected by the anticipated signal measurement means 42, the remaining signal measurement means 44 may then be checked to see which measurement means has been incorrectly connected to the strain gauge being excited. The gauges can then be reconnected correctly.

The remaining strain gauges 20 are then checked in the same manner.

In the present case, there are only two gauges 18,20 to choose from, but it will be understood that the method outlined is suited to an instrumentation system 41 wherein a plurality of sensors are used in conjunction with a plurality of signal measurement means.

In a further mode of operation, where the signal measurement means 42,44 are provided with amplification means to boost the signal for measurement, the signal measured can be compared with a predetermined signal, and the amplification adjusted where needs be, so that a correct signal amplitude is measured. In this manner, the present method can be used to calibrate an instrumentation system 41.

Figure 4:
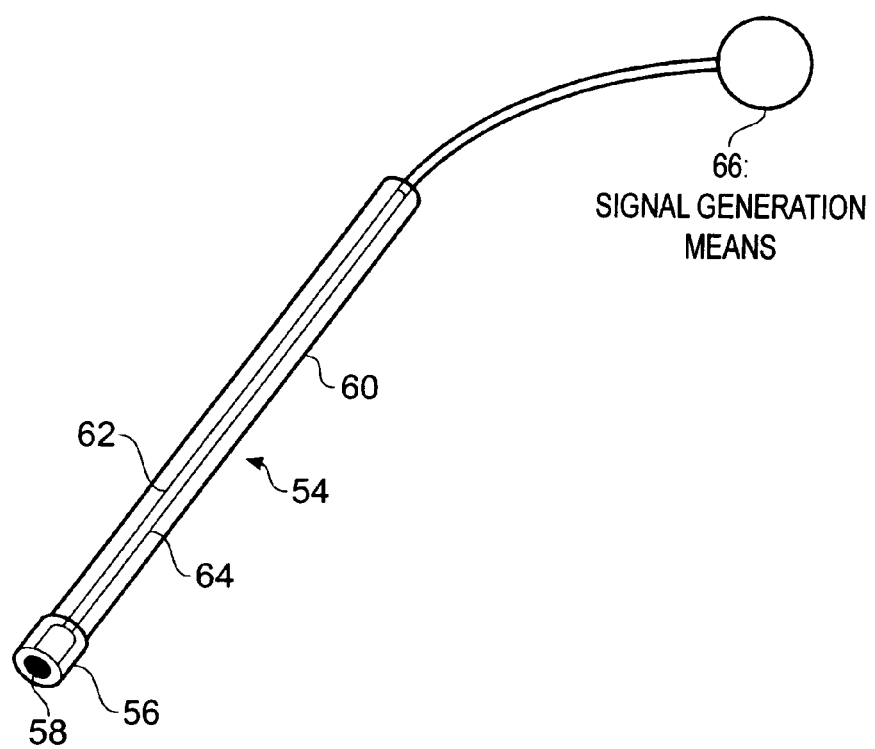
FIG. 4 shows apparatus for testing the connectivity of an instrumentation system.

Apparatus 54 used to induce the electrical signal in the strain gauge 18,20 is shown at FIG. 4. The apparatus 54 comprises a copper coil 56 wrapped around a plastic insulator 58. The coil 56 is 8 mm in diameter and 3 mm deep. It is bonded to a length of tubing 60 of about the same diameter, and wires 62,64, run through the tube, and connect the copper coil 56 to signal generation means 66. The tube 60 is at least as long as the distance between the strain gauges 18,20 and the engine duct 16. Preferably the tubing 60 is clear to permit inspection of the wires 62,64, and their connection with the coil 56.

The diameter of the coil 56 and tubing 60 are sized such that the apparatus 54 as a whole can be inserted into the engine via the boroscope holes 17 located in the duct 16. In this way, the coil 56 can be placed in proximity to gauges 18,20 not readily accessible from either the engine intake or exhaust (not shown).

In use, the apparatus 54 is passed through a boroscope 17 to lie adjacent a strain gauge 18. The apparatus signal generation means 66 is used to generate an alternating electrical signal which passes through the coil 56 and produces an oscillating electromagnetic field. This induces in the strain gauge 18 a corresponding electrical signal. An advantage of the present apparatus 54 is that the size of the electrical signal is proportional to the distance between the apparatus 54 and gauge 18. Hence, even where strain gauges 18,20 are located in close proximity, the gauge immediately adjacent the apparatus 54 will produce a larger signal than that produced by the other, more distant sensor. This enables identification at the signal measurement means 42,44 where the largest measured signal will indicate the measurement means 42,44 attached to the gauge 18 immediately adjacent the apparatus 54.

Although it will be understood that the apparatus is particularly well suited for use in conjunction with strain gauges, it will be understood that the apparatus can be used with other electrically conductive sensor to induce an electrical signal therein.

Preferably, the alternating electric signal supplied by the signal generation means 66 has a distinct waveform, which is non-sinusoidal, for example a 'two-tone' signal. This induces a distinct electrical signal in the instrumentation system which is quite different to the sinusoidal signal associated with mechanical excitation of the strain gauges. In this way, the signal cannot be confused with signals produced by accidental excitation of the engine component.

Similarly, the frequency of the alternating electric signal is chosen to be well above any natural resonant frequency of engine components. In the present example, a frequency of 16 KHz is chosen as this is well away from the natural blade frequency.

The invention claimed is:

1. A method of testing connectivity of an instrumentation system, wherein said instrumentation system comprises a plurality of sensors attached to a test piece, each of said sensors provided with electrical signal generating means and electrical signal measurement means, and at least one amplification means between a first sensor and first electrical signal measurement means, wherein each sensor is located remotely from its electrical signal measurement means, and connected thereto by connecting means, the method comprising the steps of:
inducing an electrical signal in a first sensor using a predetermined oscillation magnetic field,
checking that the electric signal is received in the corresponding signal measurement means, and
comparing the electric signal induced in the first sensor, via the electrical signal measuring means, with a predetermined output, and adjusting the amplification means to calibrate the sensor.

2. A method as claimed in claim 1 wherein the electrical signal is generated in the first sensor using an oscillating magnetic field.

3. A method as claimed in claim 2 wherein the oscillating magnetic field is generated using an electromagnet driven by an oscillating current.

4. A method as claimed in claim 3 wherein the oscillating current used has the distinct, non-sinusoidal waveform.

\* \* \* \* \*